United States Patent
Davierwalla et al.

(10) Patent No.: US 7,843,264 B2
(45) Date of Patent: Nov. 30, 2010

(54) DIFFERENTIAL AMPLIFIER WITH ACCURATE INPUT OFFSET VOLTAGE

(75) Inventors: Anosh B. Davierwalla, San Diego, CA (US); Chul Kyu Lee, San Diego, CA (US); Vannam Dang, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 145 days.

(21) Appl. No.: 12/021,477

(22) Filed: Jan. 29, 2008

(65) Prior Publication Data
US 2009/0189694 A1 Jul. 30, 2009

(51) Int. Cl.
*H03F 3/45* (2006.01)
(52) U.S. Cl. .............................. 330/253; 330/295; 330/9
(58) Field of Classification Search .................. 330/253, 330/295, 9
See application file for complete search history.

(56) References Cited

U.S. PATENT DOCUMENTS

| | | | | |
|---|---|---|---|---|
| 3,970,947 | A | * | 7/1976 | Sato et al. ................... 330/261 |
| 4,109,214 | A | * | 8/1978 | Main ........................... 330/254 |
| 5,500,623 | A | * | 3/1996 | Kimura ....................... 330/252 |
| 5,517,134 | A | | 5/1996 | Yaklin |
| 5,530,444 | A | | 6/1996 | Tice et al. |
| 5,552,734 | A | * | 9/1996 | Kimura ....................... 327/356 |
| 5,648,735 | A | | 7/1997 | Bowers et al. |
| 5,742,203 | A | * | 4/1998 | Van De Plassche et al. . 330/254 |
| 6,111,437 | A | | 8/2000 | Patel |
| 6,798,293 | B2 | | 9/2004 | Casper et al. |
| 6,871,057 | B2 | * | 3/2005 | Ugajin et al. ................ 455/323 |

FOREIGN PATENT DOCUMENTS

EP 0809351 11/1997

OTHER PUBLICATIONS

"Atherton J H et al: ""An Offset Reduction Technique for Use with CMOS Integrated Comparators and Amplifiers""IEEE Journal of Solid-State Circuits, IEEE Service Center, Piscataway, NJ, US,vol. 27, No. 8, Aug. 1, 1992, pp. 1168-1175, XP000309396".
International Search Report-PCT/US09/032308, International Search Authority-European Patent Office-Mar. 30, 2009.
Written Opinion-PCT/US09/032308, International Search Authority-European Patent Office-Mar. 30, 2009.

* cited by examiner

*Primary Examiner*—Patricia Nguyen
(74) *Attorney, Agent, or Firm*—Ramin Mobarhan (57) ABSTRACT

An amplifier with accurate input offset voltage is described. In one design, the amplifier includes first and second unbalanced differential pairs. The first unbalanced differential pair receives a differential input signal and provides a first differential current signal. The second unbalanced differential pair receives a differential reference signal and provides a second differential current signal, which is subtracted from the first differential current signal to obtain a differential output signal. The second differential current signal tracks an error current in the first differential current signal so that the differential output signal is zero when the differential input signal is equal to a target input offset voltage for the amplifier. For each unbalanced differential pair, one transistor is M times the size of the other transistor, with M being selected to obtain the target input offset voltage.

29 Claims, 9 Drawing Sheets

DIFFERENTIAL AMPLIFIER WITH ACCURATE INPUT OFFSET VOLTAGE

BACKGROUND

I. Field

The present disclosure relates generally to electronics, and more specifically to an amplifier.

II. Background

Amplifiers are commonly used to buffer and/or amplify signals to obtain the desired signal level. Amplifiers are widely used for various applications such as communication, computing, networking, consumer electronics, etc. For example, in a wireless communication device such as a cellular phone, amplifiers may be used to receive signals via data communication links for a display device, a camera, an external device, etc.

An amplifier may be used to detect a voltage difference between two complementary signal lines on a data link. These signal lines may carry a differential signal when the data link is active and may float when the data link is idle. When the signal lines float, it may be easy for noise to couple to these lines and cause a small differential signal to appear on the lines. It may be desirable to accurately detect actual signals on these lines when the data link is active and to avoid false trigger by the noise coupled to these lines when the data link is idle.

SUMMARY

An amplifier with accurate input offset voltage is described herein. The amplifier can detect a differential input signal larger than the input offset voltage and is not disturbed by noise less than the input offset voltage. The amplifier may be used for a receive end of a data communication link and may be referred to as a data receiver, receiver, etc. The amplifier may also be used for other applications in which accurate input offset voltage is desired.

In one design, the amplifier includes first and second unbalanced differential pairs. The first unbalanced differential pair receives a differential input signal and provides a first differential current signal. The second unbalanced differential pair receives a differential reference signal and provides a second differential current signal, which is subtracted from the first differential current signal to obtain a differential output signal. The first differential current signal may have an error current when the differential input signal is equal to a target input offset voltage. The second differential current signal may track the error current across temperature and other variations. The first and second unbalanced differential pairs may collectively provide a zero differential output signal when the differential input signal is equal to the target input offset voltage. The first unbalanced differential pair may receive a first bias current from a current source. The amplifier may further include a third unbalanced differential pair that receives the differential input signal and provides a second bias current for the second unbalanced differential pair. The second bias current may track the first bias current across a range of common mode voltages for the differential input signal.

In one design, each unbalanced differential pair includes two transistors, and one transistor is M times the size of the other transistor. M may be selected to obtain the target input offset voltage for the amplifier. The transistors may be N-channel metal oxide semiconductor (NMOS) transistors, P-channel metal oxide semiconductor (PMOS) transistors, etc.

Various aspects and features of the disclosure are described in further detail below.

DETAILED DESCRIPTION

Figure 1:
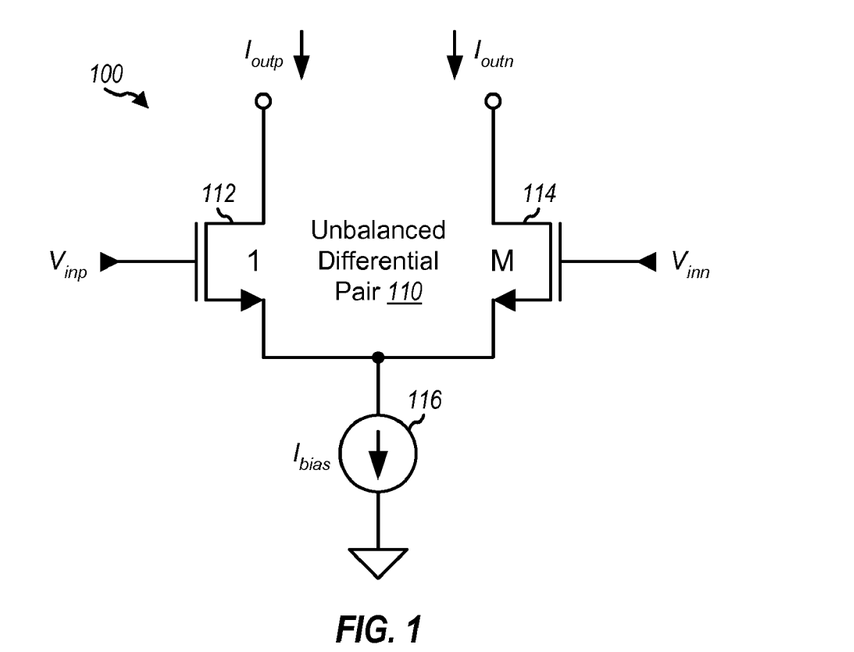
FIG. 1 shows an amplifier with process and temperature dependent input offset voltage.

FIG. 1 shows a schematic diagram of an amplifier 100 with input offset voltage, which is also referred to as input-referred offset voltage. Amplifier 100 includes an unbalanced differential pair 110 coupled to a current source 116. Differential pair 110 includes two NMOS transistors 112 and 114. NMOS transistor 112 has its gate receiving a first input voltage signal $V_{inp}$, its source coupled to a first end of current source 116, and its drain providing a first output current signal $I_{outp}$. NMOS transistor 114 has its gate receiving a second input voltage signal $V_{inn}$, its source coupled to the first end of current source 116, and its drain providing a second output current signal $I_{outn}$. Current source 116 has its second end coupled to circuit ground and provides a bias current $I_{bias}$ for NMOS transistors 112 and 114.

FIG. 1 shows a design in which differential pair 110 is implemented with NMOS transistors. A differential pair may also be implemented with PMOS transistors, bipolar junction transistors (BJTs), or some other type of transistors.

A differential input voltage signal $V_{in}$ and a differential output current signal $I_{out}$ for amplifier 100 may be expressed as:

$$V_{in} = V_{inp} - V_{inn}, \text{ and} \qquad \text{Eq (1a)}$$

$$I_{out} = I_{outp} - I_{outn}. \qquad \text{Eq (1b)}$$

Differential pair 110 may be balanced (not shown in FIG. 1), and NMOS transistors 112 and 114 may have the same size and may be matched. In this case, when $V_{inp} = V_{inn}$ and $V_{in} = 0$, half of the bias current flows through each NMOS transistor and $I_{out} = 0$.

However, it may be desirable to have an amplifier with built-in input offset so that $I_{out} = 0$ when $V_{in} = V_{os}$ instead of $V_{in} = 0$. $V_{os}$ is an input offset voltage for the amplifier. An amplifier with input offset voltage may be used for the receive end of a serial data link, which may be based on any protocol or standard such as a Mobile Display Digital Interface (MDDI) standard. The amplifier may be used to detect data link wake-up from a hibernation state.

To obtain an input offset voltage, differential pair 110 may be unbalanced (as shown in FIG. 1), and NMOS transistors 112 and 114 may have different sizes. In the design shown in FIG. 1, NMOS transistor 114 is M times larger than NMOS transistor 112, so that $(W/L)_2 = M \cdot (W/L)_1$, where $(W/L)_1$ is the width-to-length ratio of NMOS transistor 112 and $(W/L)_2$ is the width-to-length ratio of NMOS transistor 114.

For unbalanced differential pair 110, a differential input voltage is applied to the gates of NMOS transistors 112 and 114 in order to split the bias current evenly between the two NMOS transistors. The input offset voltage of amplifier 100 is the difference between $V_{inp}$ and $V_{inn}$ such that $I_{outp} = I_{outn} = I_{bias}/2$.

If NMOS transistors 112 and 114 are operated in saturation, then the input offset voltage may be given as follows:

$$V_{os} = V_{gs1} - V_{gs2} = V_{dsat1} - V_{dsat2} = V_{dsat1} \times \left(1 - \frac{1}{\sqrt{M}}\right), \quad \text{Eq (2)}$$

where $V_{gs1}$ and $V_{gs2}$ are gate-to-source voltages of NMOS transistors 112 and 114, respectively, and $V_{dsat1}$ and $V_{dsat2}$ are overdrive voltages for NMOS transistors 112 and 114, respectively. The overdrive voltage for a MOS transistor is equal to $V_{gs}$ minus a threshold voltage $V_{th}$ for the MOS transistor.

If NMOS transistors 112 and 114 are operated in weak inversion, then the input offset voltage may be given as follows:

$$V_{os} = V_{gs1} - V_{gs2} = \eta \cdot V_T \ln(M), \quad \text{Eq (3)}$$

with $$V_T = \frac{k \cdot T}{q}, \quad \text{Eq (4)}$$

where $V_T$ is a thermal voltage, T is absolute temperature (in Kelvins), $\eta$ is a non-ideality factor for a MOS transistor, k is Boltzmann constant, and q is electron charge (in Coulombs). Equations (3) and (4) indicate that the characteristics of NMOS transistors 112 and 114 resemble those of a BJT along with the non-ideality factor.

NMOS transistors 112 and 114 may be operated in weak inversion by selecting suitable sizes and/or bias current for these NMOS transistors. Weak inversion refers to a big transistor for a given amount of bias current, or a small bias current for a given transistor size. For an input differential pair that receives a differential input voltage signal, e.g., as shown in FIG. 1, the NMOS transistors are typically operated in weak inversion.

As shown in equations (2) and (3), a desired or target input offset voltage of $V_{os-target}$ may be obtained by selecting suitable values for $V_{dsat}$ and M. However, a primary drawback of the design shown in FIG. 1 is a strong dependence of the input offset voltage on temperature, since (i) $V_{dsat}$ in equation (2) is related to temperature and (ii) $V_T$ in equation (3) is linearly related to absolute temperature. Thus, regardless of whether the MOS transistors in the differential pair are operated in saturation or weak inversion, the input offset voltage typically exhibits a proportional-to-absolute-temperature (PTAT) characteristic.

Figure 2:
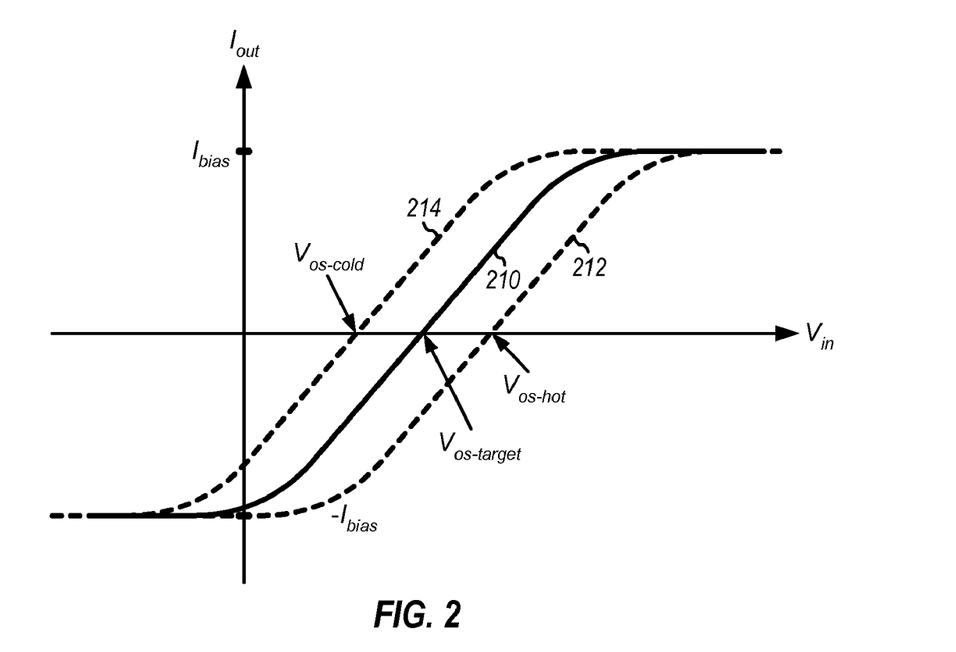
FIG. 2 shows differential output current versus differential input voltage for the amplifier in FIG. 1.

FIG. 2 shows plots of $I_{out}$ versus $V_{in}$ for amplifier 100 in FIG. 1. A plot 210 shows $I_{out}$ versus $V_{in}$ for nominal temperature of 27° Celsius (C), with $I_{out} = 0$ when $V_{in} = V_{os-target}$. A plot 212 shows $I_{out}$ versus $V_{in}$ for high temperature of 125° C., with $I_{out} = 0$ when $V_{in} = V_{os-hot}$, where $V_{os-hot}$ is the input offset voltage at high temperature. A plot 214 shows $I_{out}$ versus $V_{in}$ for low temperature of −40° C., with $I_{out} = 0$ when $V_{in} = V_{os-cold}$, where $V_{os-cold}$ is the input offset voltage at low temperature.

The input offset voltage for the design shown in FIG. 1 may deviate by ±20% or more from the target value over an operating temperature range of −40° C. to 125° C. Furthermore, the input offset voltage in the design shown in FIG. 1 does not track very well with variations in integrated circuit (IC) process.

Figure 3:
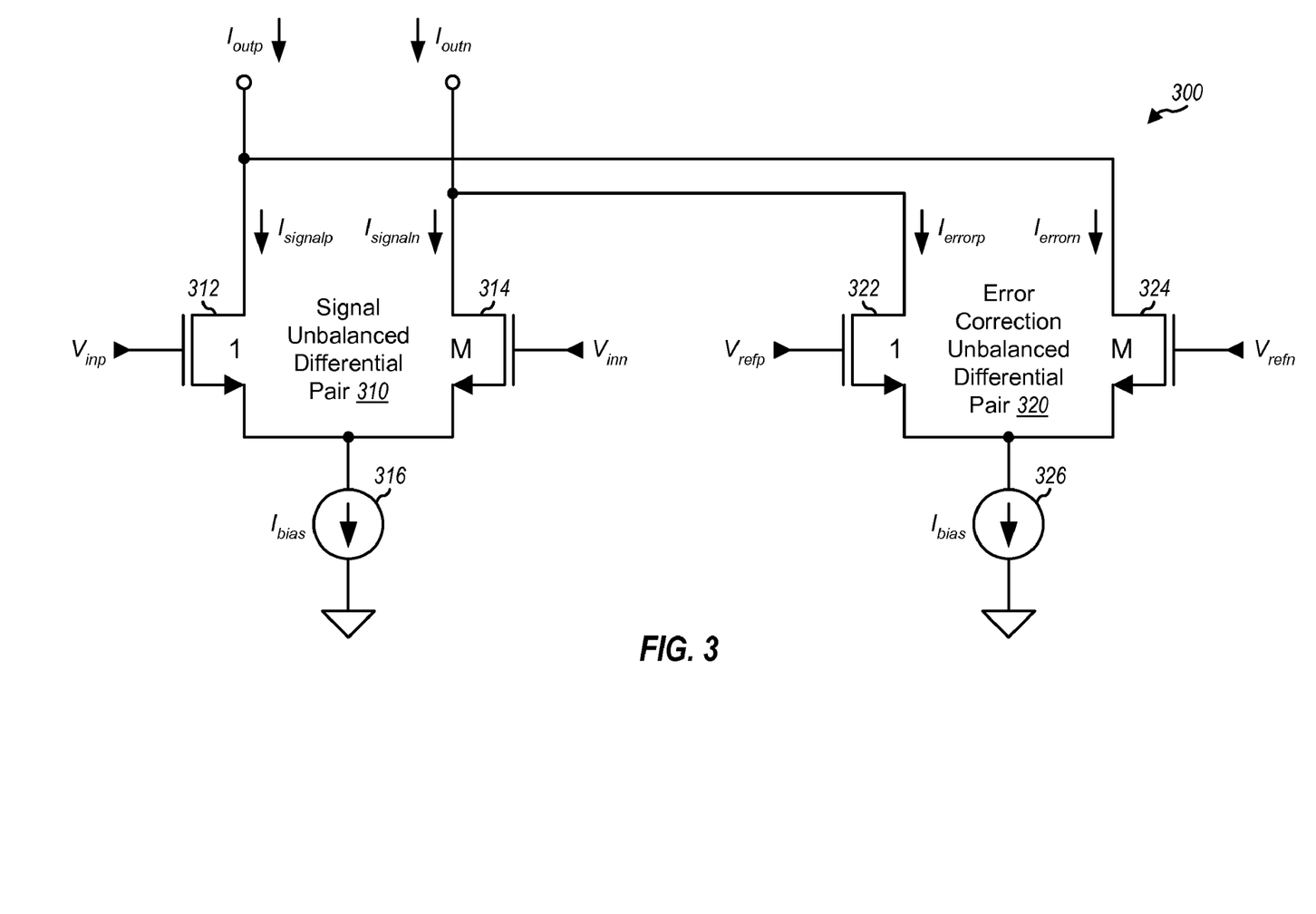
FIG. 3 shows an amplifier with accurate input offset voltage.

FIG. 3 shows a schematic diagram of a design of an amplifier 300 with accurate input offset voltage over temperature, IC process, and power supply variations. Amplifier 300 includes a signal unbalanced differential pair 310, an error correction unbalanced differential pair 320, and current sources 316 and 326. Differential pair 310 includes NMOS transistors 312 and 314 that are coupled to current source 316 in the same manner as NMOS transistors 112 and 114 and current source 116 in FIG. 1. NMOS transistors 312 and 314 provide complementary signal currents $I_{signalp}$ and $I_{signaln}$, respectively.

Differential pair 320 includes NMOS transistors 322 and 324. NMOS transistor 322 has its gate receiving a first reference voltage $V_{refp}$, its source coupled to a first end of current source 326, and its drain coupled to the drain of NMOS transistor 314. NMOS transistor 324 has its gate receiving a second reference voltage $V_{refn}$, its source coupled to the first end of current source 326, and its drain coupled to the drain of NMOS transistor 312. NMOS transistors 322 and 324 provide complementary error correction currents $I_{errorp}$ and $I_{errorn}$, respectively. Current source 326 has its second end coupled to circuit ground and provides a bias current $I_{bias}$ for NMOS transistors 322 and 324.

A differential input voltage signal $V_{in}$ for differential pair 310 and a differential reference voltage $V_{ref}$ for differential pair 320 may be expressed as:

$$V_{in} = V_{inp} - V_{inn}, \text{ and} \quad \text{Eq (5a)}$$

$$V_{ref} = V_{refp} - V_{refn}. \quad \text{Eq (5b)}$$

A differential signal current $I_{signal}$ from differential pair 310, a differential error correction current $I_{error}$ from differential pair 320, and a differential output current signal $I_{out}$ from amplifier 300 may be expressed as:

$$I_{signal} = I_{signalp} - I_{signaln}, \quad \text{Eq (6a)}$$

$$I_{error} = I_{errorp} - I_{errorn}, \text{ and} \quad \text{Eq (6b)}$$

$$I_{out} = I_{signal} - I_{error}. \quad \text{Eq (6c)}$$

In the design shown in FIG. 3, differential pairs 310 and 320 are both unbalanced, with NMOS transistor 314 being M times larger than NMOS transistor 312, and NMOS transistor 324 being M times larger than NMOS transistor 322. Furthermore, NMOS transistor 322 is matched to NMOS transistor 312, and NMOS transistor 324 is matched to NMOS transistor 314.

A suitable value of M may be selected such that a target input offset voltage of $V_{os-target}$ can be obtained for differential pair 310 operating alone at a nominal temperature. The input offset voltage for differential pair 310 may vary with temperature, IC process, and power supply, as described above. When the input offset voltage wanders away from the target value due to temperature, IC process, and/or power supply variations, a differential input voltage of $V_{os-target}$ results in $I_{signal}$ being equal to a non-zero differential current instead of zero. This non-zero differential current is referred to as an error current $I_{error}'$.

Differential pair 320 estimates the error current corresponding to $V_{in}=V_{os\text{-}target}$ in differential pair 310 and provides the differential error correction current $I_{error}$, which should be equal to the error current. The differential error correction current is subtracted from the differential signal current by cross-coupling the drains of NMOS transistors 322 and 324 to the drains of NMOS transistors 314 and 312, respectively, as shown in FIG. 3. If the error correction current is equal to the error current, then the output current $I_{out}$ would be zero at $V_{in}=V_{os\text{-}target}$, and the input offset voltage of differential pair 310 is essentially restored to the target value.

The error current of differential pair 310 may vary with temperature, IC process, and power supply. The error correction current from differential pair 320 should match the error current over temperature, IC process, and power supply variations in order to obtain zero output current when the target input offset voltage is applied to differential pair 310.

The error current that exists with the target input offset voltage applied to differential pair 310 may be estimated by applying a differential reference voltage of $V_{ref}=V_{os\text{-}target}$ (with a suitable common mode voltage) to differential pair 320. Since differential pair 320 is matched to differential pair 310, the error correction current from differential pair 320 should closely match the error current in differential pair 310 when the target input offset voltage is applied to both differential pairs 310 and 320. Furthermore, since differential pairs 310 and 320 are matched, the error correction current should track the error current across temperature, IC process, and power supply variations. Hence, an accurate input offset voltage can be achieved for amplifier 300.

Figure 4A:
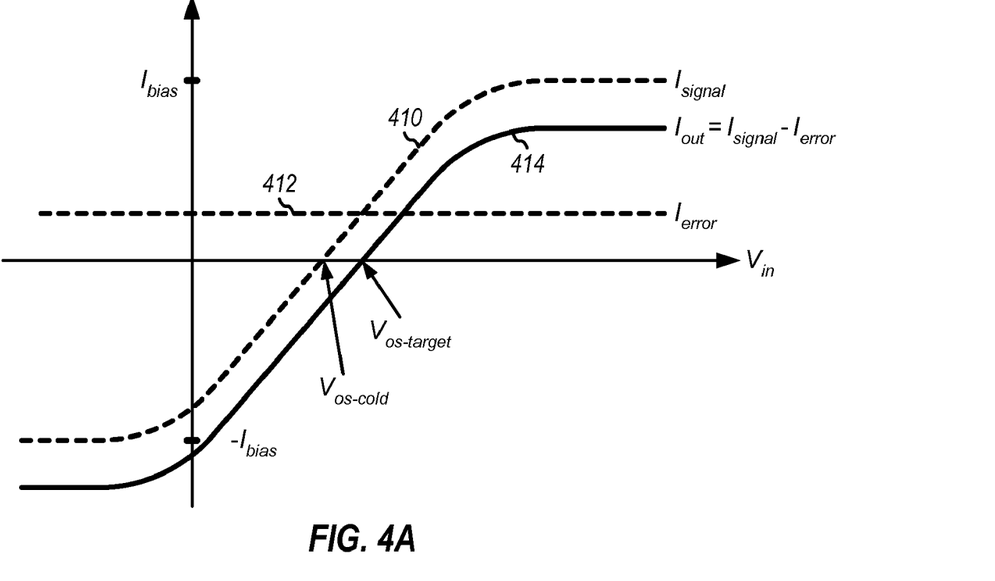
FIGS. 4A and 4B show differential output current versus differential input voltage for different temperatures for the amplifier in FIG. 3.

FIG. 4A shows plots of $I_{signal}$, $I_{error}$ and $I_{out}$ versus $V_{in}$ for amplifier 300 in FIG. 3 at cold temperature of −40° C. A plot 410 shows $I_{signal}$ versus $V_{in}$ for differential pair 310. Plot 410 matches plot 214 in FIG. 2 and has $I_{signal}=0$ when $V_{in}=V_{os\text{-}cold}$. A plot 412 shows $I_{error}$ versus $V_{in}$ for differential pair 320. Because differential pair 320 receives $V_{ref}=V_{os\text{-}target}$ instead of $V_{in}$, $I_{error}$ is not a function of $V_{in}$, and plot 412 is a horizontal line. A plot 414 shows $I_{out}$ versus $V_{in}$. Since $I_{out}$ is obtained by subtracting $I_{error}$ from $I_{signal}$, plot 414 is obtained by shifting plot 410 down by $I_{error}$. Plot 414 approximately matches plot 210 in FIG. 2 over a range of $V_{in}$ and has $I_{out}=0$ when $V_{in}=V_{os\text{-}target}$.

Figure 4B:
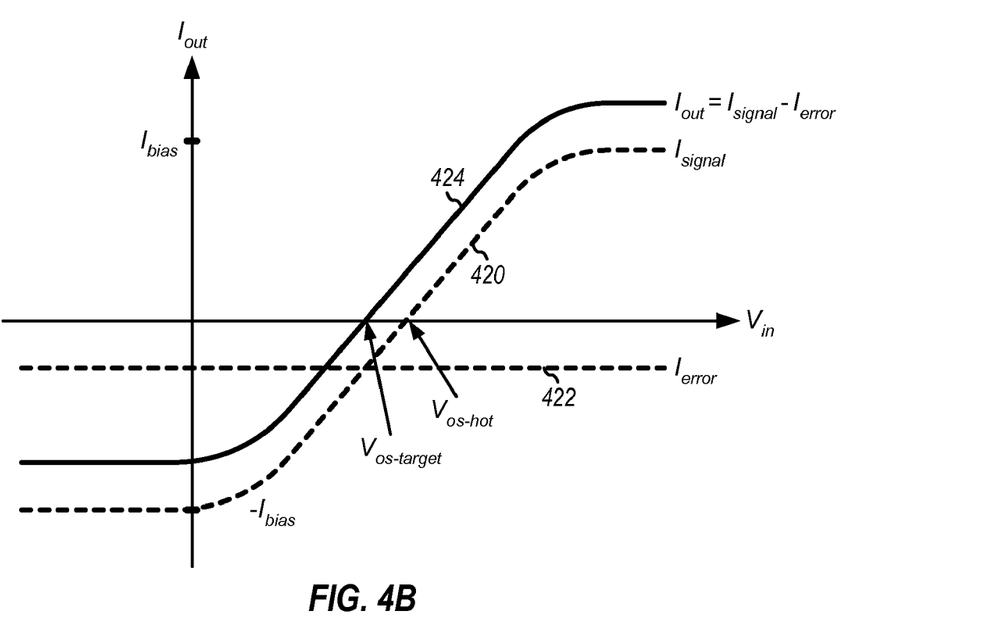

FIG. 4B shows plots of $I_{signal}$, $I_{error}$ and $I_{out}$ versus $V_{in}$ for amplifier 300 in FIG. 3 at hot temperature of 125° C. A plot 420 shows $I_{signal}$ versus $V_{in}$ for differential pair 310. Plot 420 matches plot 212 in FIG. 2 and has $I_{signal}=0$ when $V_{in}=V_{os\text{-}hot}$. A plot 422 shows $I_{error}$ versus $V_{in}$ for differential pair 320. $I_{error}$ is not a function of $V_{in}$, and plot 422 is a horizontal line. A plot 424 shows $I_{out}$ versus $V_{in}$. Since $I_{out}$ is obtained by subtracting $I_{error}$ from $I_{signal}$ and since $I_{error}$ is negative, plot 424 is obtained by shifting plot 420 up by $I_{error}$. Plot 424 approximately matches plot 210 in FIG. 2 over a range of $V_{in}$ and has $I_{out}=0$ when $V_{in}=V_{os\text{-}target}$.

As shown in FIGS. 4A and 4B, the error correction current may be used to account for the error current in the signal current. Furthermore, the error correction current tracks the error current across temperature variations, as shown in FIGS. 4A and 4B, as well as across IC process and power supply variations.

Unbalanced differential pairs 310 and 320 may be replaced with balanced differential pairs. Balanced differential pair 310 may then have a nominal input offset voltage of $V_{os}=0V$, and balanced differential pair 320 may generate an offset current such that the input offset voltage is at the target value of $V_{os\text{-}target}$. However, it may be difficult to obtain a large input offset voltage using balanced differential pairs 310 and 320. Furthermore, the entire $I_{out}$ curve may be moved down or up by a large amount in order to obtain the target input offset voltage, which may impact performance with respect to speed, temperature, and other factors.

The common mode voltage of the differential input voltage signal applied to signal differential pair 310 may swing from rail to rail, e.g., from the power supply voltage to circuit ground. The bias current for differential pair 310 may vary with the common mode voltage for $V_{in}$ and may turn off at low common mode voltage. On the other hand, error correction differential pair 320 operates with the differential reference voltage having a fixed common mode voltage. As a result, the bias current for differential pair 320 does not vary or turn off. It may be desirable for the bias current of error correction differential pair 320 to closely track the bias current of signal differential pair 310. This may then allow the target input offset voltage to be obtained for a wide range of common mode voltages.

Figure 5A:
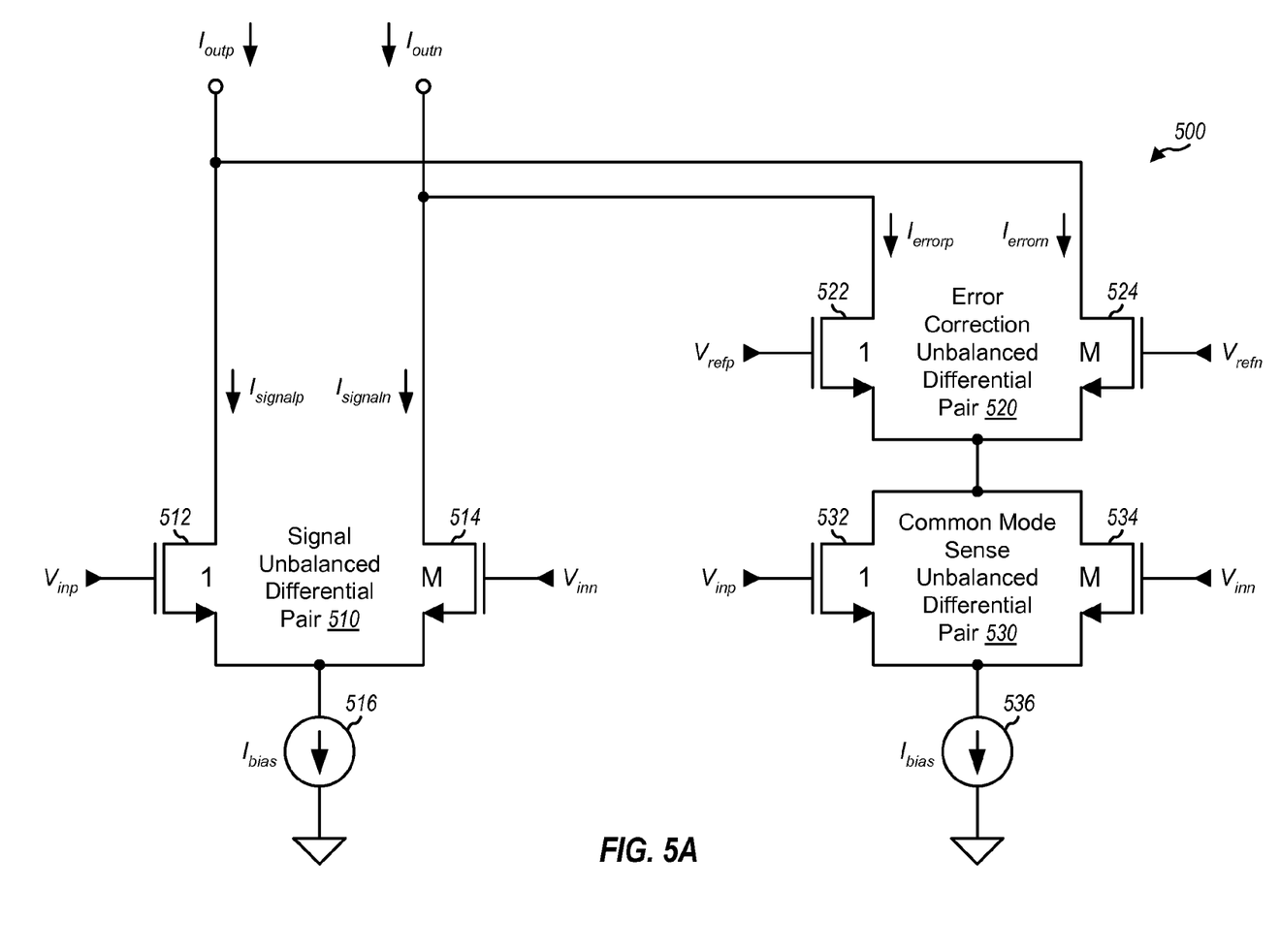
FIGS. 5A and 5B show two NMOS amplifiers with accurate input offset voltage.

FIG. 5A shows a schematic diagram of a design of an amplifier 500 with accurate input offset voltage over temperature, IC process, and power supply variations as well as over a range of common mode voltages for the differential input voltage signal. Amplifier 500 includes a signal unbalanced differential pair 510, an error correction unbalanced differential pair 520, a common mode sense unbalanced differential pair 530, and current sources 516 and 536. Differential pair 510 includes NMOS transistors 512 and 514 that are coupled to current source 516 in the same manner as NMOS transistors 312 and 314 and current source 316 in FIG. 3. NMOS transistors 512 and 514 provide complementary signal currents $I_{signalp}$ and $I_{signaln}$, respectively. Differential pair 520 includes NMOS transistors 522 and 524 that are coupled in the same manner as NMOS transistors 322 and 324 in FIG. 3. NMOS transistors 522 and 524 provide complementary error correction currents $I_{errorp}$ and $I_{errorn}$, respectively. Differential pair 530 includes NMOS transistors 532 and 534 having their sources coupled together and to one end of current source 536, their drains coupled together and to the sources of NMOS transistors 522 and 524, and their gates receiving the complementary input signals $V_{inp}$ and $V_{inn}$, respectively.

Differential pairs 510, 520 and 530 are unbalanced, with NMOS transistor 514 being M times larger than NMOS transistor 512, NMOS transistor 524 being M times larger than NMOS transistor 522, and NMOS transistor 534 being M times larger than NMOS transistor 532. Furthermore, NMOS transistors 512, 522 and 532 are matched, and NMOS transistors 514, 524 and 534 are also matched.

Differential pairs 510 and 520 operate as described above for differential pairs 310 and 320, respectively, in FIG. 3. Common mode sense differential pair 530 provides the bias current for differential pair 520 and generates this bias current to track the bias current for differential pair 510. Differential pair 530 is matched to differential pair 510 but has the drains of NMOS transistors 532 and 534 coupled together. Since the differential input signal is applied to both differential pairs 510 and 530, the common mode voltage applied across current source 536 is equal to the common mode voltage applied across current source 516. The bias current from current source 536 can thus track the bias current from current source 516 over the entire range of common mode voltages for $V_{in}$.

Figure 5B:
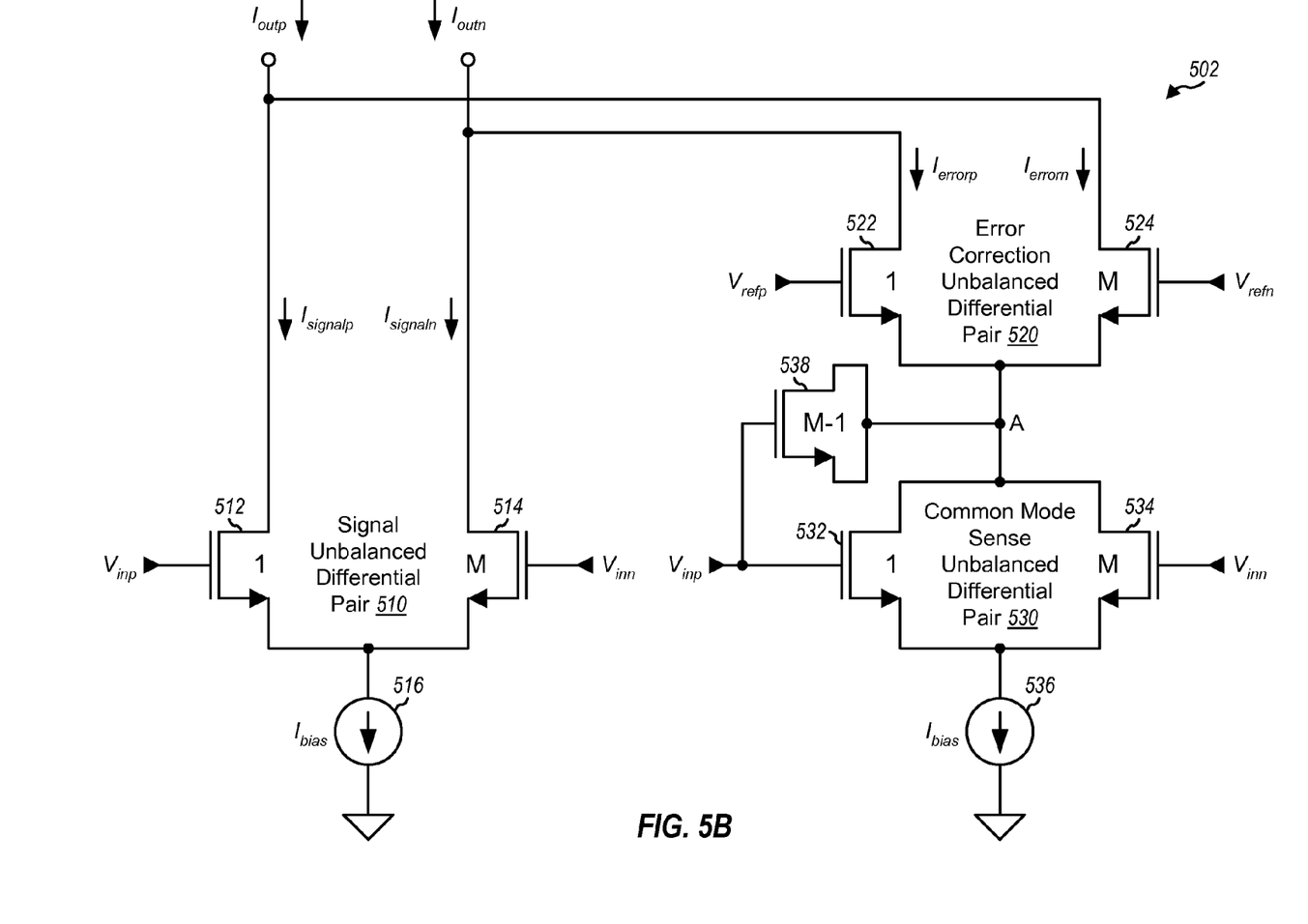

FIG. 5B shows a schematic diagram of a design of an amplifier 502 with accurate input offset voltage. Amplifier 502 includes all of the circuit elements in amplifier 500 in FIG. 5A and further includes an NMOS transistor 538. NMOS transistor 538 has its gate coupled to the gate of NMOS transistor 532 and its drain and source coupled together and to the drain of NMOS transistor 532, which is node A. NMOS transistor 538 has a size of M−1. The total size of NMOS transistors 532 and 538 is equal to the size of NMOS transistor 534. The complementary input signals $V_{inp}$ and $V_{inn}$ would then observe similar capacitances to node A, which may improve performance.

Differential pairs 510, 520 and 530 in FIGS. 5A and 5B may be implemented with unbalanced differential pairs. Differential pairs 510, 520 and 530 may also be implemented with balanced differential pairs.

Figure 6:
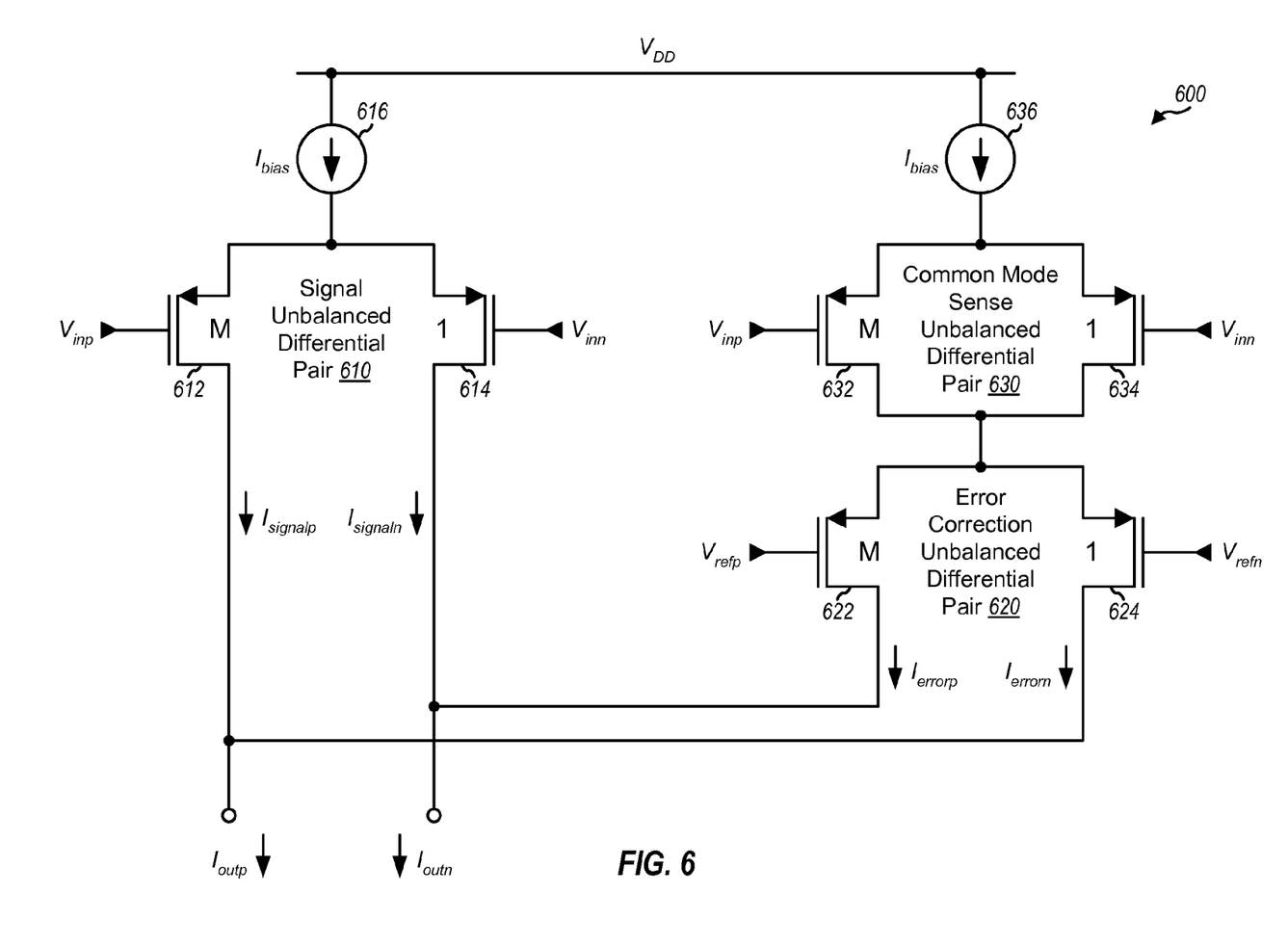
FIG. 6 shows a PMOS amplifier with accurate input offset voltage.

FIG. 6 shows a schematic diagram of a design of an amplifier 600 with accurate input offset voltage and implemented with PMOS transistors. Amplifier 600 includes a signal unbalanced differential pair 610 composed of PMOS transistors 612 and 614, an error correction unbalanced differential pair 620 composed of PMOS transistors 622 and 624, a common mode sense unbalanced differential pair 630 composed of PMOS transistors 632 and 634, and current sources 616 and 636. The PMOS transistors and current sources in amplifier 600 are coupled in similar manner as the NMOS transistors and current sources in amplifier 500 in FIG. 5A. PMOS transistors 612, 622 and 632 have sizes of M whereas PMOS transistors 614, 624 and 634 have sizes of 1. The input signal $V_{inp}$ is applied to the larger PMOS transistors 612 and 632 whereas the input signal $V_{inn}$ is applied to the smaller PMOS transistors 614 and 634, which is opposite of amplifier 500.

Differential pairs 610, 620 and 630 in FIG. 6 may be implemented with unbalanced differential pairs. Differential pairs 610, 620 and 630 may also be implemented with balanced differential pairs.

In general, an amplifier implemented with NMOS transistors (e.g., amplifier 500 in FIG. 5A) may not be able to detect low input signals near circuit ground. This is because the input signals should be sufficiently high above circuit ground in order to turn on the NMOS transistors in the signal differential pair. Conversely, an amplifier implemented with PMOS transistors (e.g., amplifier 600 in FIG. 6) may not be able to detect high input signals. This is because the input signals should be sufficiently below the power supply voltage in order to turn on the PMOS transistors in the signal differential pair.

Figure 7:
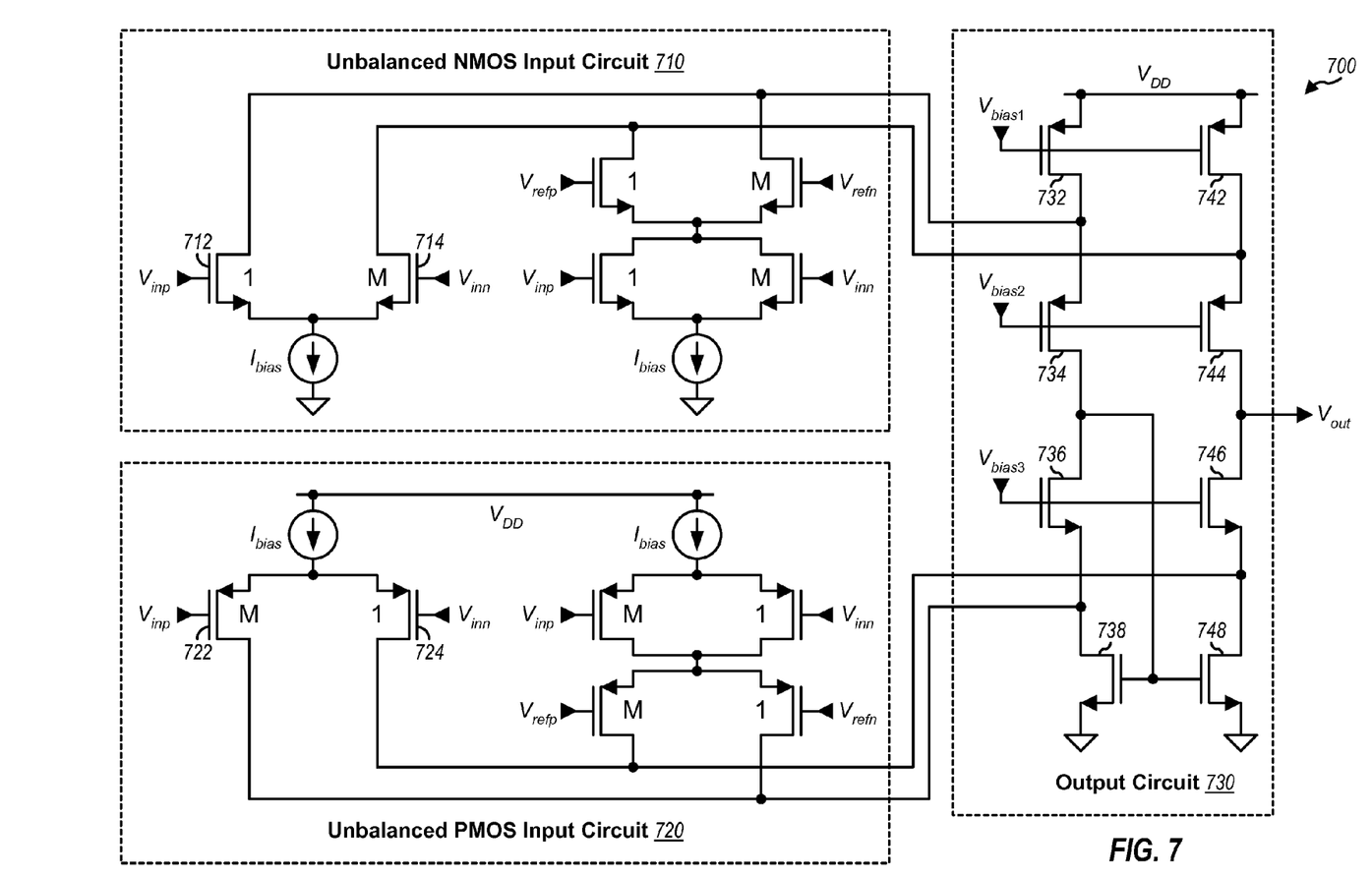
FIG. 7 shows a NMOS and PMOS amplifier with accurate input offset voltage.

FIG. 7 shows a schematic diagram of a design of an amplifier 700 with accurate input offset voltage and implemented with both NMOS and PMOS transistors. Amplifier 700 includes an unbalanced NMOS input circuit 710, an unbalanced PMOS input circuit 720, and an output circuit 730. Unbalanced NMOS input circuit 710 may be implemented with amplifier 300 in FIG. 3, amplifier 500 in FIG. 5A (as shown in FIG. 7), amplifier 502 in FIG. 5B, or some other design. Unbalanced PMOS input circuit 720 may be implemented with amplifier 600 in FIG. 6 (as shown in FIG. 7) or some other design.

For output circuit 730, PMOS transistors 732 and 742 have their sources coupled to the power supply, their gates receiving a first bias voltage $V_{bias1}$, and their drains coupled to the drains of NMOS transistors 712 and 714, respectively, in unbalanced PMOS input circuit 710. PMOS transistors 734 and 744 have their sources coupled to the drains of PMOS transistors 732 and 742, respectively, and their gates receiving a second bias voltage $V_{bias2}$. NMOS transistors 736 and 746 have their drains coupled to the drains of PMOS transistors 734 and 744, respectively, their gates receiving a third bias voltage $V_{bias3}$, and their sources coupled to the drains of NMOS transistors 738 and 748, respectively. NMOS transistors 738 and 748 have their sources coupled to circuit ground, their gates coupled together and to the drain of NMOS transistor 736, and their drains coupled to the drains of PMOS transistors 722 and 724, respectively, in unbalanced NMOS input circuit 720. The drains of MOS transistors 744 and 746 provide an output voltage signal $V_{out}$. The MOS transistors in each pair are matched and have the same size. The output circuit may also be implemented with other designs.

Output circuit 730 combines the differential currents from unbalanced MOS input circuits 710 and 720 and generates the output voltage. NMOS transistors 712 and 714, PMOS transistors 732 and 742, and PMOS transistors 734 and 744 form a differential folded cascode. NMOS transistors 712 and 714 generate the output current. PMOS transistors 732 and 742 form a current source having high output impendence. PMOS transistors 734 and 744 are cascode devices having low input impedance. The output current from NMOS transistors 712 and 714 thus flows into the cascode devices. PMOS transistors 722 and 724, NMOS transistors 736 and 746, and NMOS transistors 738 and 748 form another differential folded cascode that operates in a similar manner. The signal currents entering the folded cascade structures are combined and translated into a single-ended output voltage by way of the high output impedance of the output circuit 730.

Unbalanced NMOS input circuit 710 can detect the differential input signal with mid and high common mode voltages. Unbalanced PMOS input circuit 720 can detect the differential input signal with mid and low common mode voltages. The combination of unbalanced MOS input circuits 710 and 720 allows amplifier 700 to detect the differential input signal with rail-to-rail common mode voltages. An error correction unbalanced differential pair may be used for input offset error correction in each unbalanced MOS input circuit in order to obtain accurate input offset voltage for that unbalanced MOS input circuit. Furthermore, a common mode sense unbalanced differential pair may be used in each unbalanced MOS input circuit to match the bias current for the error correction unbalanced differential pair to the bias current for the signal differential pair.

Figure 8:
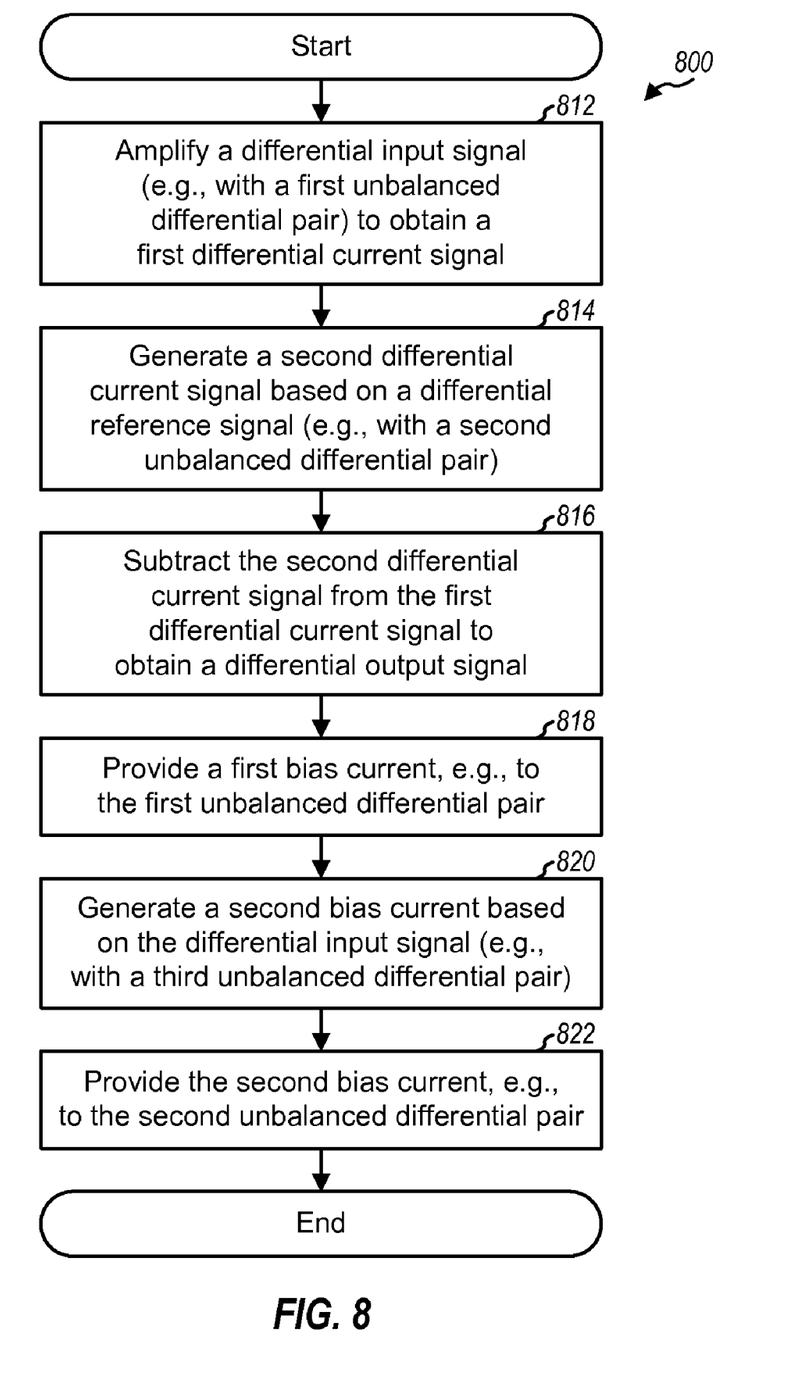
FIG. 8 shows a process for receiving and amplifying a signal.

FIG. 8 shows a design of a process 800 for receiving and amplifying a signal. A differential input signal may be amplified (e.g., with a first/signal unbalanced differential pair) to obtain a first differential current signal (block 812). A second differential current signal may be generated based on a differential reference signal (e.g., with a second/error correction unbalanced differential pair) (block 814). The second differential current signal may be subtracted from the first differential current signal to obtain a differential output signal (block 816).

The first differential current signal may have an error current when the differential input signal is equal to a target input offset voltage. The second differential current signal may be generated to obtain a zero differential output signal when the differential input signal is equal to the target input offset voltage. The second differential current signal may track the error current across temperature variations, etc.

A first bias current may be provided, e.g., to the first unbalanced differential pair (block 818). A second bias current may be generated based on the differential input signal (e.g., with a third/common mode sense unbalanced differential pair) (block 820). The second bias current may track the first bias current across a range of common mode voltages for the differential input signal. The second bias current may be provided, e.g., to the second unbalanced differential pair (block 822).

The first, second and third unbalanced differential pairs may be implemented with NMOS transistors or PMOS transistors. The differential input signal may also be amplified with a second set of first, second and third unbalanced differential pairs implemented with complementary type of transistors, e.g., as shown in FIG. 7.

The amplifier with accurate input offset voltage described herein may be used for various applications such as communication, computing, networking, personal electronics, etc. For example, the amplifier may be used for wireless communication devices, cellular phones, personal digital assistants (PDAs), handheld devices, gaming devices, computing devices, laptop computers, consumer electronics devices, personal computers, cordless phones, etc. An example use of the amplifier in a wireless communication device is described below.

Figure 9:
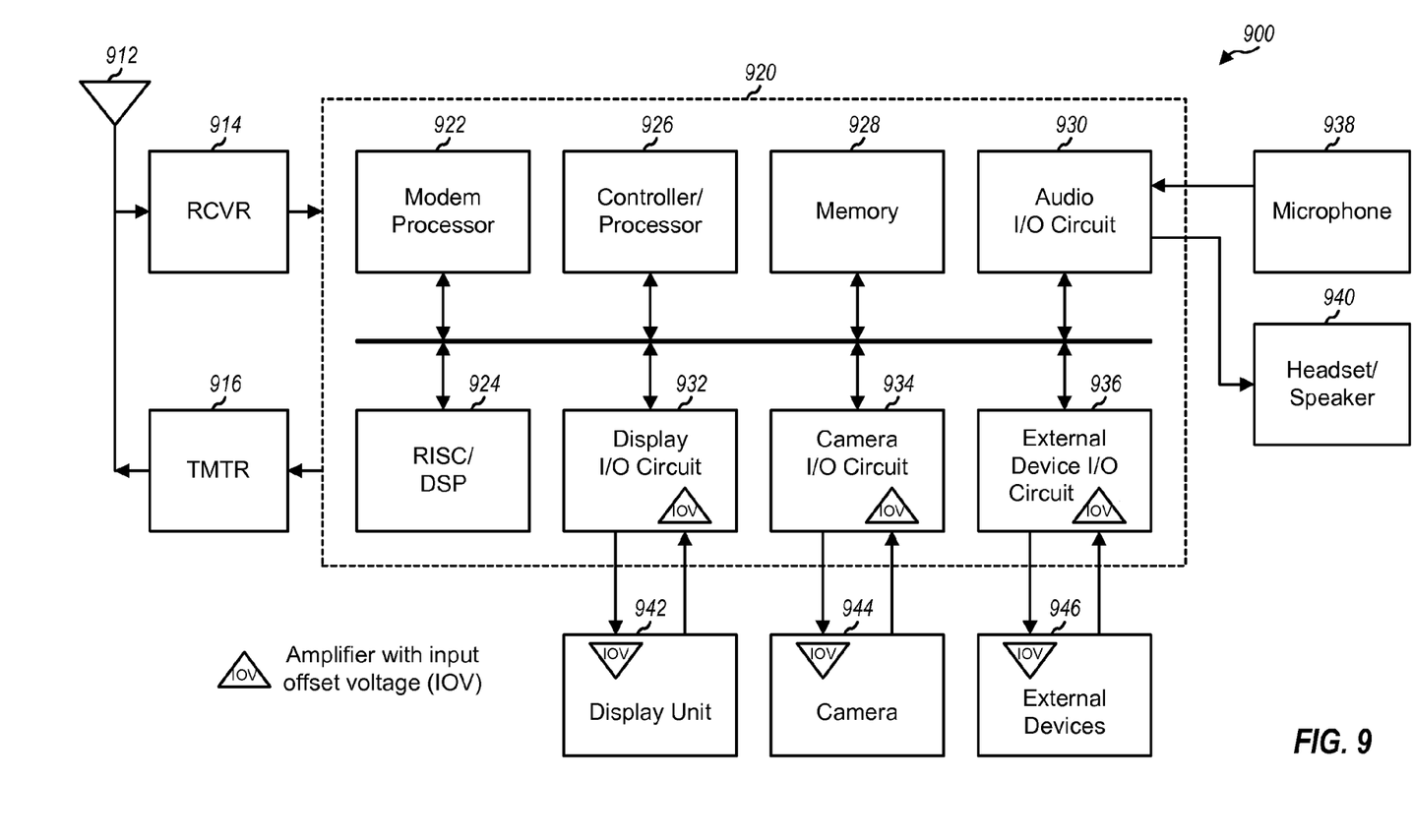
FIG. 9 shows a wireless communication device.

FIG. 9 shows a block diagram of a design of a wireless communication device 900 for a wireless communication system. Wireless device 900 may be a cellular phone, a terminal, a handset, a wireless modem, etc. The wireless communication system may be a Code Division Multiple Access (CDMA) system, a Global System for Mobile Communications (GSM) system, etc.

Wireless device 900 is capable of providing bi-directional communication via a receive path and a transmit path. In the receive path, signals transmitted by base stations are received by an antenna 912 and provided to a receiver (RCVR) 914. Receiver 914 conditions and digitizes the received signal and provides samples to a section 920 for further processing. In the transmit path, a transmitter (TMTR) 916 receives data to be transmitted from section 920, processes and conditions the data, and generates a modulated signal, which is transmitted via antenna 912 to the base stations. Receiver 914 and transmitter 916 may support CDMA, GSM, etc.

Section 920 includes various processing, interface and memory units such as, for example, a modem processor 922, a reduced instruction set computer/digital signal processor (RISC/DSP) 924, a controller/processor 926, a memory 928, an audio input/output (I/O) circuit 930, a display I/O circuit 932, a camera I/O circuit 934, and an external device I/O circuit 936. Modem processor 922 may perform processing for data transmission and reception, e.g., encoding, modulation, demodulation, decoding, etc. RISC/DSP 924 may perform general and specialized processing for wireless device 900. Controller/processor 926 may direct the operation of various units within section 920. Memory 928 may store data and/or instructions for various units within section 920.

Audio I/O circuit 930 may receive an input signal from a microphone 938 and provide an output signal to a headset/speaker 940. Display I/O circuit 932 may communicate with a display unit 942 via a first data link. Camera I/O circuit 934 may communicate with a camera 944 via a second data link. External device I/O circuit 936 may communicate with external devices 946 via a third data link.

As shown in FIG. 9, the amplifier described herein may be used in various blocks in which input offset voltage is desirable or required. For example, the amplifier may be used in display I/O circuit 932 and display unit 942 on the receive ends of the first data link, in camera I/O circuit 934 and camera 944 on the receive ends of the second data link, in external device I/O circuit 936 and external devices 946 on the receive ends of the third data link, etc.

The amplifier with input offset voltage described herein may be implemented on an IC, an analog IC, a radio frequency IC (RFIC), a digital IC, a mixed-signal IC, an application specific integrated circuit (ASIC), a printed circuit board (PCB), an electronics device, etc. The amplifier may also be fabricated with various IC process technologies such as complementary metal oxide semiconductor (CMOS), NMOS, PMOS, BJT, bipolar-CMOS (BiCMOS), silicon germanium (SiGe), gallium arsenide (GaAs), etc.

An apparatus implementing the amplifier described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
a first unbalanced differential pair configured to receive a differential input signal and provide a first differential current signal; and
a second unbalanced differential pair coupled to the first unbalanced differential pair and configured to receive a differential reference signal and provide a second differential current signal, the second differential current signal being subtracted from the first differential current signal to obtain a differential output signal, wherein one transistor in the first unbalanced differential pair is a different size than one transistor in the second unbalanced differential pair and the second differential current signal tracks at least a portion of the first differential current signal.

2. The apparatus of claim 1, wherein the first and second unbalanced differential pairs are configured to provide a zero differential output signal when the differential input signal is equal to a target input offset voltage.

3. The apparatus of claim 2, wherein the first differential current signal comprises an error current when the differential input signal is equal to the target input offset voltage, and wherein the second differential current signal tracks the error current across temperature variations.

4. The apparatus of claim 2, wherein the differential reference signal is set based on the target input offset voltage.

5. The apparatus of claim 1, wherein the first unbalanced differential pair comprises first and second transistors, the first transistor having a first size and the second transistor having a second size that is M times the first size, where M is greater than one.

6. The apparatus of claim 5, wherein the second unbalanced differential pair comprises third and fourth transistors, the third transistor having the first size and the fourth transistor having the second size.

7. The apparatus of claim 1, wherein the first unbalanced differential pair is configured to receive a first bias current, and wherein the apparatus further comprises:
a third unbalanced differential pair coupled to the second unbalanced differential pair and configured to receive the differential input signal and provide a second bias current for the second unbalanced differential pair.

8. The apparatus of claim 7, wherein the first unbalanced differential pair comprises first and second transistors, the second unbalanced differential pair comprises third and fourth transistors, and the third unbalanced differential pair comprises fifth and sixth transistors, wherein the first, third and fifth transistors have a first size, and wherein the second, fourth and sixth transistors have a second size that is M times the first size, where M is greater than one.

9. The apparatus of claim 8, further comprising:
a seventh transistor having a gate coupled to a gate of the fifth transistor and a drain and a source coupled together and to a drain of the fifth transistor, the seventh transistor having a third size that is M−1 times the first size.

10. The apparatus of claim 1, wherein the first and second unbalanced differential pairs comprise N-channel metal oxide semiconductor (NMOS) transistors.

11. The apparatus of claim 1, wherein the first and second unbalanced differential pairs comprise P-channel metal oxide semiconductor (PMOS) transistors.

12. The apparatus of claim 1, further comprising:
a third unbalanced differential pair configured to receive the differential input signal and provide a third differential current signal; and
a fourth unbalanced differential pair coupled to the third unbalanced differential pair and configured to receive the differential reference signal and provide a fourth differential current signal, the fourth differential current signal being subtracted from the third differential current signal to obtain a second differential output signal, wherein the first and second unbalanced differential pairs comprise N-channel metal oxide semiconductor (NMOS) transistors, and wherein the third and fourth unbalanced differential pairs comprise P-channel metal oxide semiconductor (PMOS) transistors.

13. The apparatus of claim 12, wherein the first unbalanced differential pair is configured to receive a first bias current and the third unbalanced differential pair is configured to receive a third bias current, and wherein the apparatus further comprises:
a fifth unbalanced differential pair coupled to the second unbalanced differential pair and configured to receive the differential input signal and provide a second bias current for the second unbalanced differential pair; and
a sixth unbalanced differential pair coupled to the fourth unbalanced differential pair and configured to receive the differential input signal and provide a fourth bias current for the fourth unbalanced differential pair.

14. The apparatus of claim 12, further comprising:
an output circuit coupled to the first and third unbalanced differential pairs and configured to receive and combine the differential output signal from the first unbalanced differential pair and the second differential output signal from the second unbalanced differential pair and to provide a final output signal.

15. An integrated circuit comprising:
a first unbalanced differential pair configured to receive a differential input signal and provide a first differential current signal; and
a second unbalanced differential pair coupled to the first unbalanced differential pair and configured to receive a differential reference signal and provide a second differential current signal, the second differential current signal being subtracted from the first differential current signal to obtain a differential output signal, wherein one transistor in the first unbalanced differential pair is a different size than one transistor in the second unbalanced differential pair and the second differential current signal tracks at least a portion of the first differential current signal.

16. The integrated circuit of claim 15, wherein the first and second unbalanced differential pairs are configured to provide a zero differential output signal when the differential input signal is equal to a target input offset voltage.

17. The integrated circuit of claim 16, wherein the first differential current signal comprises an error current when the differential input signal is equal to the target input offset voltage, and wherein the second differential current signal tracks the error current across temperature variations.

18. The integrated circuit of claim 15, wherein the first unbalanced differential pair comprises first and second transistors, the first transistor having a first size and the second transistor having a second size that is M times the first size, where M is greater than one.

19. The integrated circuit of claim 18, wherein the second unbalanced differential pair comprises third and fourth transistors, the third transistor having the first size and the fourth transistor having the second size.

20. The integrated circuit of claim 15, wherein the first unbalanced differential pair is configured to receive a first bias current, and wherein the integrated circuit further comprises:
a third unbalanced differential pair coupled to the second unbalanced differential pair and configured to receive the differential input signal and provide a second bias current for the second unbalanced differential pair.

21. A wireless device comprising:
an amplifier comprising first and second unbalanced differential pairs, the first unbalanced differential pair configured to receive a differential input signal via a data communication link and provide a first differential current signal, and the second unbalanced differential pair being coupled to the first unbalanced differential pair and configured to receive a differential reference signal and provide a second differential current signal, the second differential current signal being subtracted from the first differential current signal to obtain a differential output signal, wherein one transistor in the first unbalanced differential pair is a different size than one transistor in the second unbalanced differential pair and the second differential current signal tracks at least a portion of the first differential current signal.

22. An apparatus comprising:
a first differential pair configured to receive a differential input signal and a first bias current and provide a first differential current signal;
a second differential pair coupled to the first differential pair and configured to receive a differential reference signal and provide a second differential current signal, the second differential current signal being subtracted from the first differential current signal to obtain a differential output signal; and
a third differential pair coupled to the second differential pair and configured to receive the differential input signal and provide a second bias current for the second differential pair.

23. The apparatus of claim 22, wherein the first, second and third differential pairs are unbalanced differential pairs.

24. The apparatus of claim 23, wherein each of the first, second and third differential pairs comprises first and second transistors, the first transistor having a first size and the second transistor having a second size that is M times the first size, where M is greater than one.

25. The apparatus of claim 22, wherein the first, second and third differential pairs are balanced differential pairs.

26. An apparatus comprising:
means for amplifying a differential input signal to obtain a first differential current signal;
means for generating a second differential current signal based on a differential reference signal; and
means for subtracting the second differential current signal from the first differential current signal to obtain a differential output signal, the differential output signal being equal to zero when the differential input signal is equal to a target input offset voltage, wherein one transistor in the first unbalanced differential pair is a different size than one transistor in the second unbalanced differential pair and the second differential current signal tracks at least a portion of the first differential current signal.

27. The apparatus of claim 26, wherein the first differential current signal comprises an error current when the differential input signal is equal to the target input offset voltage, and wherein the means for generating the second differential current signal comprises means for generating the second differential current signal to track the error current across temperature variations.

28. The apparatus of claim 26, further comprising:

means for providing a first bias current to the means for amplifying the differential input signal;

means for generating a second bias current based on the differential input signal, the second bias current tracking the first bias current across a range of common mode voltages for the differential input signal; and means for providing the second bias current to the means for generating the second differential current signal.

29. A method comprising:

amplifying a differential input signal to obtain a first differential current signal;

generating a second differential current signal based on a differential reference signal; and subtracting the second differential current signal from the first differential current signal to obtain a differential output signal, the differential output signal being equal to zero when the differential input signal is equal to a target input offset voltage, wherein one transistor in the first unbalanced differential pair is a different size than one transistor in the second unbalanced differential pair and the second differential current signal tracks at least a portion of the first differential current signal.

* * * * *